(12) United States Patent
Ayraud et al.

(10) Patent No.: US 11,515,899 B2
(45) Date of Patent: Nov. 29, 2022

(54) CALIBRATION OF AN RF ATTENUATOR

(71) Applicant: STMicroelectronics (Grenoble 2) SAS, Grenoble (FR)

(72) Inventors: Michel Ayraud, Voreppe (FR); Philippe Level, Saint Egreve (FR)

(73) Assignee: STMicroelectronics (Grenoble 2) SAS, Grenoble (FR)

(*) Notice: Subject to any disclaimer, the term of this patent is extended or adjusted under 35 U.S.C. 154(b) by 0 days.

(21) Appl. No.: 17/648,993

(22) Filed: Jan. 26, 2022

(65) Prior Publication Data
US 2022/0278701 A1 Sep. 1, 2022

(30) Foreign Application Priority Data
Feb. 26, 2021 (FR) ...................... 2101889

(51) Int. Cl.
*H04B 14/06* (2006.01)
*H04B 1/00* (2006.01)
*H04B 1/30* (2006.01)
*H04B 1/16* (2006.01)

(52) U.S. Cl.
CPC ......... *H04B 1/0078* (2013.01); *H04B 1/1615* (2013.01); *H04B 1/30* (2013.01); *H04B 2001/307* (2013.01)

(58) Field of Classification Search
CPC ...... H04B 1/0078; H04B 1/16; H04B 1/1615; H04B 1/30; H03H 2/008; H03H 7/38
See application file for complete search history.

(56) References Cited

U.S. PATENT DOCUMENTS

| | | | |
|---|---|---|---|
| 9,154,166 B2* | 10/2015 | Darabi | H04B 1/52 |
| 9,748,993 B2* | 8/2017 | Fong | H04B 1/1638 |
| 10,396,736 B2 | 8/2019 | Ayraud et al. | |
| 2005/0186927 A1* | 8/2005 | Hayashi | H04B 1/30 455/252.1 |
| 2007/0207759 A1 | 9/2007 | Vavelidis et al. | |
| 2012/0243640 A1 | 9/2012 | Babitch et al. | |
| 2018/0152158 A1 | 5/2018 | Ayraud et al. | |

* cited by examiner

*Primary Examiner* — Tuan Pham
(74) *Attorney, Agent, or Firm* — Slater Matsil, LLP

(57) ABSTRACT

The present disclosure relates to a circuit including an input terminal configured to receive a first signal at a first frequency; a demodulation chain connected to the input terminal and including a low-noise amplifier having an input coupled to the terminal; a controllable variable impedance connected between a first node and a node configured to receive a reference potential, the first node being connected to the input terminal and/or to the amplifier input; and a current source configured to deliver a current at the first frequency to the first node.

20 Claims, 3 Drawing Sheets

CALIBRATION OF AN RF ATTENUATOR

CROSS-REFERENCE TO RELATED APPLICATIONS

This application claims the benefit of French Patent Application No. 2101889, filed on Feb. 26, 2021, which application is hereby incorporated herein by reference.

TECHNICAL FIELD

The present description generally concerns electronic circuits, and more particularly circuits of wireless reception of a sub-GHz radio frequency signal.

BACKGROUND

Sub-GHz radio frequency signals have frequencies in the range, for example, from 300 MHz to 1 GHz. These sub-GHz signals are used to transmit data in wireless fashion between a transmit circuit configured to transmit a sub-GHz signal and a receive circuit configured to receive the sub-GHz signal.

The receive circuit is coupled to an antenna by an impedance matching network. The receive circuit comprises a demodulation chain to extract data from a signal supplied by the antenna to the receive circuit.

The demodulation chain, also called receive chain, usual comprises a low-noise amplifier. To avoid for the receive chain to saturate when the power of the signal received on the antenna is too high, or to avoid for the gain of the receive chain to be too low when the power of the signal received on the antenna is low, the receive chain comprises a controllable attenuator. The gain of the receive chain then depends on the attenuator control or, in other words, on the attenuation applied by the controllable attenuator to the sub-GHz signal received by the receive circuit. By properly controlling the attenuator, the gain of the receive chain is adapted to the power of the sub-GHz signal received by the antenna.

In practice, to control the attenuator, a phase of calibration of the attenuator is provided. During this calibration phase, a sub-GHz signal is delivered to the antenna and the value of a corresponding signal at the output of the receive chain is observed, by varying the value of the attenuator impedance. The attenuation introduced by the attenuator on the sub-GHz signal received by the demodulation chain is then deduced for each of these impedance values. Thus, when the receive circuit is operating, an attenuation value is selected according to the amplitude of the output signal of the chain, and the impedance value of the attenuator that corresponded to this attenuation during the calibration phase is selected.

However, this calibration phase is tedious to implement, in particular since it requires accurately transmitting a sub-GHz signal in an anechoic environment. Further, this step does not take into account the disturbances undergone by the antenna and its impedance matching network in their environment of use, particularly when the antenna is arranged close to a conductive element.

SUMMARY

There thus is a need to overcome all or part of the disadvantages of known methods of calibration of an attenuator of a radio frequency signal receive chain, and more particular of a sub-GHz signal receive chain.

There also is a need to overcome all or part of the disadvantages of known circuits comprising a receive chain, where such calibration methods are implemented.

An embodiment overcomes all or part of the disadvantages of known methods of calibration of an attenuator of a radio frequency signal receive chain, and more particularly of a sub-GHz signal receive chain, and of known circuits configured to implement these known methods.

One embodiment provides a circuit comprising an input terminal configured to receive a first signal at a first frequency; a demodulation chain connected to the input terminal and comprising a low-noise amplifier having an input coupled, preferably connected, to the terminal; a controllable variable impedance connected between a first node and a node configured to receive a reference potential, the first node being connected to the input terminal and/or to the amplifier input; and a current source configured to deliver a current at the first frequency to the first node.

According to one embodiment, the current source comprises a first circuit configured to deliver a second signal at a frequency of a local oscillator of the demodulation chain; a second circuit configured to deliver a third signal at an intermediate frequency of the demodulation chain; a frequency mixer configured to receive the second and third signals, an output of the frequency mixer being coupled, preferably connected, to an internal node of the current source; and a resistor coupling the internal node to the first node.

According to one embodiment, the third signal is a square signal and the frequency mixer is a switch-mode mixer controlled by the third signal.

According to one embodiment, the second circuit comprises an oscillator configured to deliver a signal at a frequency greater than the intermediate frequency of the demodulation chain, and a frequency divider configured to deliver the third signal from the signal delivered by the oscillator.

According to one embodiment, the oscillator of the second circuit is a quartz oscillator.

According to one embodiment, the mixer comprises a first switch connected between the output of the mixer and a node configured to receive the second signal, and a second switch connected between the output of the mixer and the node configured to receive the reference potential, the first and second switches being configured to be controlled in phase opposition from the third signal.

According to one embodiment, the first circuit comprises a circuit configured to deliver a fourth square signal at a frequency equal to four times the frequency of the local oscillator; a first frequency divider configured to divide by two the frequency of the fourth signal; a second frequency divider configured to divide by four the frequency of the fourth signal; a two-input gate configured to receive an output signal of the first frequency divider and an output signal of the second frequency divider, the gate being configured to implement an XOR function between the signals received by its inputs; a first resistor coupling an output of the second frequency divider to an output of the first circuit; and a second resistor coupling an output of the gate to the output of the first circuit.

According to one embodiment, a value of the first resistor is substantially equal, for example, equal, to 0.348/0.84 times a value of the second resistor.

According to one embodiment, the current source comprises a common-mode removal capacitive element, the resistor coupling the internal node of the current source to the first node being series-connected with the common-mode removal capacitive element between the internal node and the first node.

According to one embodiment, the current source is further configured to be selectively turned on or off.

Another embodiment provides a method of using a circuit as described, comprising the steps of a) selecting a value of the controlled variable impedance; b) obtaining a signal at the output of the demodulation chain while the current is delivered to the first node by the current source; and c) deducing, for the impedance value selected at step a), an attenuation value introduced into the receive chain by the variable impedance, at least from the signal obtained at step b).

According to one embodiment, the method further comprises, between steps a) and c), a step b') comprising obtaining a signal at the output of the demodulation chain while the current source is off, and wherein, at step c), the attenuation value is deduced at least from the signal obtained at step b) and from the signal obtained at step b').

According to one embodiment, steps a) and c) are repeated for each of a plurality of values of the variable impedance.

According to one embodiment, at one of steps a), the variable impedance is equivalent to an open circuit for the selected value.

According to one embodiment, at each step c), the attenuation value is deduced at least from the signal observed at the corresponding step b) and from the signal observed at step b) when the variable impedance is equivalent to an open circuit.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION OF ILLUSTRATIVE EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, usual demodulation chains of a sub-GHz wireless signal receive circuit have not all been detailed, the described embodiments, implementations and variants being compatible with the usual demodulation chains.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
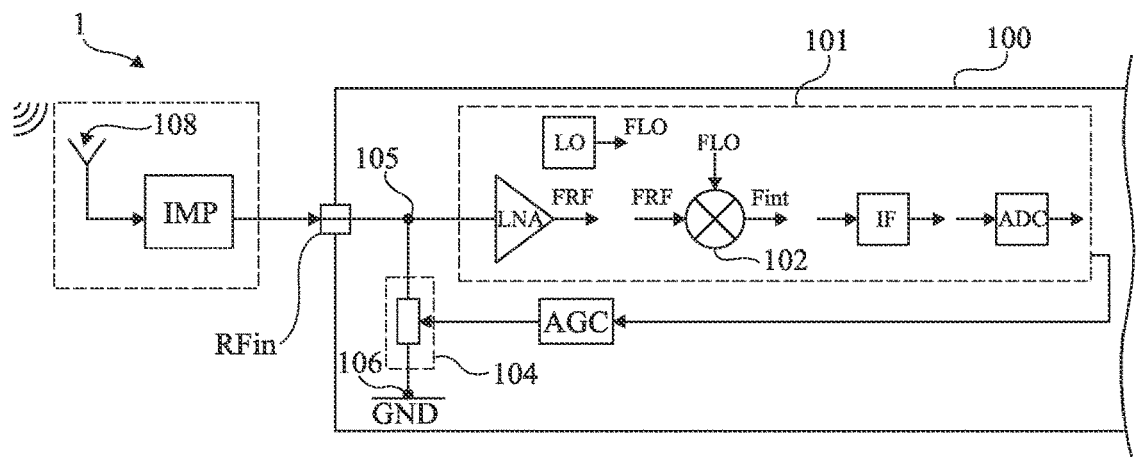
FIG. 1 schematically shows, in the form of blocks, an example of a device of the type to which the described embodiments apply.

FIG. 1 schematically shows, in the form of blocks, an example of a device 1 of the type to which the described embodiments apply.

Device 1 comprises a circuit 100. Circuit 100 comprises an input terminal RFin configured to receive a sub-GHz signal at a frequency FRF. Circuit 100 comprises a receive chain 101 connected to terminal RFin. The receive chain 101 is configured to extract data from the signal received on terminal RFin. The receive chain 101 comprises a low-noise amplifier LNA having an input coupled, for example, connected, to terminal RFin. The output of the amplifier LNA is connected to the rest of the receive chain 101.

As it is known from those skilled in the art, further to the amplifier LNA, the receive chain 101 comprises at least one local oscillator LO configured to deliver a signal at a frequency FLO.

Further, the receive chain 101 comprises at least one mixer 102. Mixer 102 is configured to multiply, or combine, a signal at the frequency FRF delivered on an output of the amplifier LNA and a signal at the local frequency FLO. The output signal of mixer 102 thus comprises two frequencies f1 and f2, respectively equal to FRF+FLO and FRF−FLO, one of the two frequencies, for example, the frequency f2, being called intermediate frequency Fint of the receive chain 101. As an example, frequency Fint is in the range from 200 KHz to 500 KHz, for example equal to 300 KHz.

As an example, the receive chain 101 comprises only one mixer 102 having an input coupled, for example, connected, to the output of the amplifier LNA, and another input configured to receive a signal at the frequency FLO.

According to another example, the receive chain 101 comprises a first mixer 102 and a second mixer 102 (not shown on FIG. 1) having each an input coupled, for example, connected, to the output of the amplifier LNA. First mixer 102 has another input configured to receive a first signal at the frequency FLO. Second mixer 102 has another input configured to receive a second signal at the frequency FLO, but 90° out of phase compare to the first signal.

The receive chain 101 further comprises at least one filter IF configured to receive the output signal of at least one mixer 102, and to deliver a filtered signal devoid of the frequency f1 or f2 which is not equal to the frequency Fint. The filtered signal comprises the frequency f1 or f2 which is equal to the frequency Fint.

As an example, the chain 101 comprises a unique filter IF when it comprises a unique mixer 102.

According to another example, when the chain 101 comprises two mixers 102, as it has been described above as an example, the chain 101 comprises a first filter IF configured to receive the output signal of the first mixer 102 and a second filter IF configured to receive the output signal of the second mixer 102. One of these two filters IF then delivers a signal I and the other filter IF delivers a signal Q in quadrature with respect to signal I.

According to yet another example, when the chain 101 comprises two mixers 102, as it has been described above as an example, the chain 101 comprises a unique filter IF, generally called complex or polyphase filter, receiving the output signal from each of the two mixers 102. Filter IF delivers the two signals I and Q.

The receive chain 101 further comprises at least one analog-to-digital converter ADC. The converter ADC is configured to sample an analog signal of the receive chain 101 at the frequency Fint. Preferably, the converter(s) ADC are disposed after the filter(s) IF, that is to say downstream of filters IF with respect to the propagation direction of a signal in the chain 101.

As an example, when the chain 101 comprises only one mixer 102 and only one filter IF, the chain 101 comprises only one converter ADC, the converter ADC having an input coupled to the output of the filter IF.

According to another example, when the chain 101 comprises two mixers 102 and one or two filters IF configured to provide signals I and Q, the receive chain 101 comprises a first converter ADC having its input coupled to an output of filter providing the signal I, and a second converter ADC having its input coupled to an output of filter providing the signal Q.

The receive chain delivers at least one output signal, and, more particularly, at least one digital output signal. The output signal(s) of the receive chain 101 are, for example, provided to a digital processing circuit (not shown on FIG. 1) of the circuit 100.

Further, although not illustrated on FIG. 1, preferably, the receive chain 101 comprises an image frequency rejection device or function. This image frequency Fim is equal to FLO−Fint, respectively to FLO+Fint, when the frequency FRF is equal to FLO+Fint, respectively to FLO−Fint.

As an example, the image frequency rejection device is a band pass filter letting pass the frequency FRF but blocking the frequency Fim. This filter is, for example, disposed between the terminal RFin and the input of the amplifier LNA, or between the output of the amplifier LNA and the mixer(s) 102. However, this type of filter is generally difficult to implement, and, in particular, difficult to integrate in a monolithic fashion, especially when frequency Fint is low, for example, lower than 10 MHz.

According to another example, the image frequency rejection image is implemented by the filter IF in case where the latest is a complex or polyphase filter. In this case, the possible contribution of the image frequency in signals I and Q provided by the complex or polyphase filter is suppressed.

According to another example, the image rejection device is implemented after filters IF providing signals I and Q. For example, the image frequency rejection device comprises a phase shifter configured to apply a 90° phase shift to signal Q, and to sum the signal I with the phase shifted signal Q available at the output of the phase shifter. The image frequency Fim rejection device is configured to deliver a signal at the frequency Fint, in which the possible contribution of the image frequency Fim is suppressed. This image frequency rejection device may be implemented in an analog fashion, and is then disposed before the converters ADC of the signals I and Q, or in a digital fashion, and is then disposed after the converters ADC coupled to the outputs of the filters IF.

All that has been described above in relation with the receive chain 101 is usual for those skilled in the art, and the embodiments, implementations and variants described are not limited to the example of chain 101 given above.

To adjust the amplitude of the output signal of the amplifier LNA, circuit 100 comprises a controllable attenuator 104, delimited by dotted lines in FIG. 1.

Attenuator 104 corresponds to a controllable impedance connected between a node 106 configured to receive a reference potential, preferably ground GND, and the input of the amplifier LNA or the terminal RFin. Said in other words, the impedance 104 has a conduction terminal coupled, preferably connected, to node 106, and another conduction terminal coupled, preferably connected, to the input RFin or the input of the amplifier LNA. In other words, the impedance 104 has a conduction terminal coupled, preferably connected, to node 106, and another conduction terminal coupled, preferably connected, to a node 105, node 105 being connected to the input of the amplifier LNA and/or to the terminal RFin. Preferably, terminal RFin and the input of the amplifier LNA are one and the same.

Circuit 100, for example, its receive chain, further comprises a circuit AGC configured to control attenuator 104, that is, to control the value of impedance 104. Circuit AGC is for example programmed during a calibration phase so that, according to one or several output signals of the receive chain 101, circuit AGC controls a change of value of attenuator 104 to adapt the gain of the attenuator 104 to the power of the sub-GHz signal received by terminal RFin. For example, when an output signal of the receive chain 101 has an amplitude upper than a given maximal amplitude, for example corresponding to the half of the full scale of the converter(s) ADC, attenuator 104 is controlled to add a given step to the attenuation applied to the signal received on terminal RFin. Still as an example, on the contrary, when an output signal of the receive chain 101 has an amplitude lower than a given minimal amplitude, for example, corresponding to a tenth or a quarter of the full scale of the converter(s) ADC, the attenuator 104 is controlled to remove the given step from the attenuation applied to the signal received on terminal RFin. As an example, the output signal of the chain 101 having its amplitude compared to minimal and maximal values in order to determine the control of the attenuator 104 corresponds to the modulus of signals I and Q, that is, to a signal equal to the square root of the sum of the signal I squared with the signal Q squared.

Device 1 further comprises an antenna 108 and an impedance matching network IMP. Network IMP couples antenna 108 to terminal RFin. Thus, when a sub-GHz signal is received by antenna 108, a corresponding signal is received on terminal RFin. In practice, antenna 108 and the network are external to circuit 100. For example, circuit 100 is implemented on an integrated circuit chip, where antenna 108 and network IMP do not form part of this chip.

As previously indicated, in device 1, the step of calibration of attenuator 104 is tedious to implement, and does not take into account outer disturbances to which antenna 108 and network IMP may be submitted in their environment of use.

Figure 2:
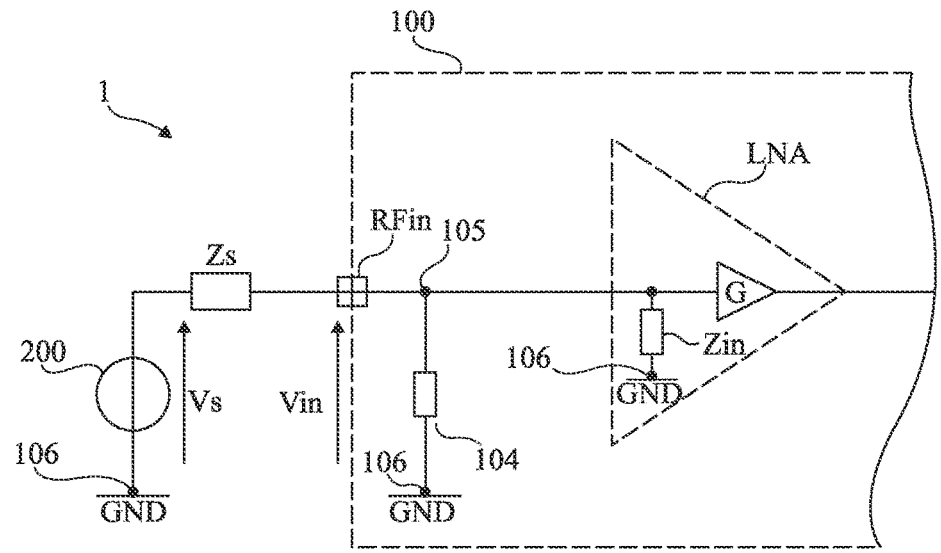
FIG. 2 shows, in the form of an equivalent circuit, a portion of the device of FIG. 1.

FIG. 2 shows, in the form of an equivalent circuit, a portion of the device 1 of FIG. 1. More particularly, FIG. 2 shows the assembly of the antenna 108 and of the network IMP of the device 1 of FIG. 1, as well as the attenuator 104 and the amplifier LNA of the circuit 100 of FIG. 1.

FIG. 2 shows the assembly of antenna 108 and of network IMP (delimited by dotted lines in FIG. 1), when a sub-GHz signal is received by the antenna, for example, during a phase of calibration, as a voltage source 200 and an impedance Zs series-connected between node 106 and the terminal RFin of circuit 100. In other words, the assembly of antenna 108 and of network IMP (delimited in dotted lines in FIG. 1) is equivalent to voltage source 200 and impedance Zs series-connected between the node 106 and the terminal RFin of circuit 100, as shown in FIG. 2.

Further, in FIG. 2, the amplifier LNA is shown as a gain G and an input impedance Zin. In other words, the amplifier LNA is equivalent to gain G and to impedance Zin. Input impedance Zin is, for example, connected between the input of the amplifier LNA and node 106.

Call Zatt the impedance of attenuator 104, Vs the voltage delivered by voltage source 200, Vin the voltage on terminal RFin, and Zeq the impedance equivalent to the parallel connection, between terminal RFin and node 106, of attenuator 104 and of impedance Zin.

When attenuator 104 is absent, that is, when impedance Zatt is infinite and attenuator 104 corresponds to an open circuit, voltage Vin is equal to voltage Vs multiplied by Zin/(Zin+Zs). When attenuator 104 is present, that is, impedance Zatt is not infinite and attenuator 104 does not correspond to an open circuit, voltage Vin is equal to voltage Vs multiplied by Zeq/(Zeq+Zs).

Thus, in FIG. 2, the attenuation resulting from attenuator 104 is equal, when it is expressed in dB, to 20*log((Zeq/(Zeq+Zs))*((Zin+Zs)/Zin))).

Figure 3:
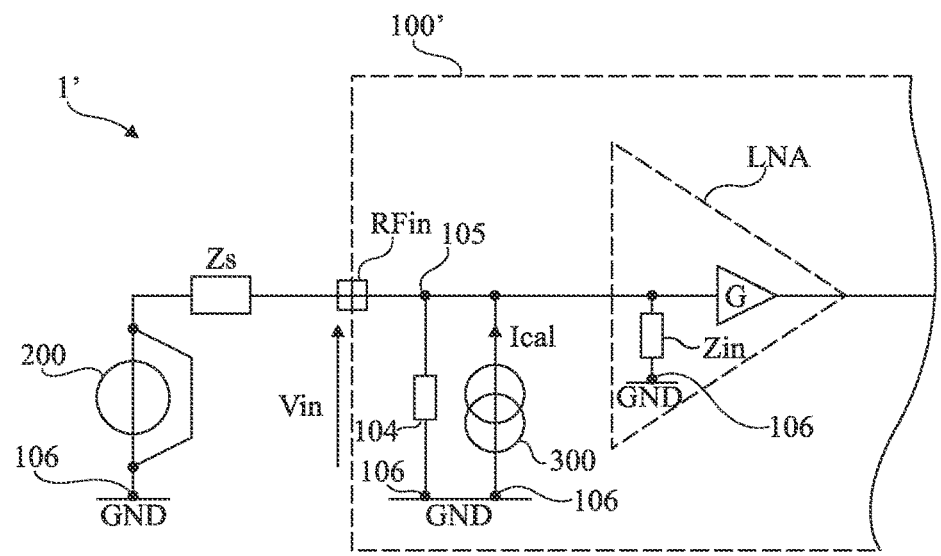
FIG. 3 shows, in the form of an equivalent circuit, an embodiment of a portion of a device similar to the device of FIG. 1.

FIG. 3 shows, in the form of an equivalent circuit, an embodiment of a portion of a device 1' similar to the device 1 of FIG. 1.

In particular, device 1' comprises, like device 1, the assembly of antenna 108 and of network IMP (FIG. 1) shown in FIG. 3 in the same way as in FIG. 2. Device 1' further comprises, instead of circuit 100, a circuit 100' comprising terminal RFin and a receive chain 101 connected to terminal RFin. In FIG. 3, only the attenuator 104 and the amplifier LNA of circuit 100' are shown, the rest of the receive chain 101 for example being similar or identical to what has been described in relation with FIG. 1. The input of the amplifier LNA is coupled, for example, connected, to the terminal RFin.

As compared with the circuit 100 of FIGS. 1 and 2, the circuit 100' further comprises a current source 300. Current source 300 is connected in parallel with impedance 104. Said in other words, the current source 300 is connected between terminal RFin and node 106 when the impedance 104 is connected between terminal RFin and node 106, or between the input of the amplifier LNA and node 106 when the impedance 104 is connected between the input of the amplifier LNA and node 106. Said in other words, the current source 300 is connected between nodes 105 and 106, node 105 being connected to terminal RFin and/or to the input of the amplifier LNA. Current source 300 is configured to deliver a current ical to node 105, the frequency of current ical being equal to the frequency FRF of the signal Vin received on terminal RFin. In the example of FIG. 3, the input of the amplifier LNA and the terminal RFin are one and the same. However, in another example not illustrated, a filter implementing an image frequency rejection function is connected between the terminal RFin and the input of the amplifier LNA, that is, between the terminal RFin and the node 105, or between the node 105 and the input of the amplifier LNA.

Further, as compared with FIG. 2, in the embodiment of FIG. 3, voltage source 200 is shown as being shorted.

As in FIG. 2, call Zatt the impedance of attenuator 104, Vin the voltage on terminal RFin, and Zeq the impedance equivalent to the parallel connection, between terminal RFin and node 106, of attenuator 104 and of impedance Zin.

When attenuator 104 is absent, voltage Vin is equal to current ical multiplied by (Zin*Zs)/(Zin+Zs). When attenuator 104 is present, voltage Vin is equal to current ical multiplied by (Zeq*Zs)/(Zeq+Zs). Thus, the attenuation of voltage Vin resulting from attenuator 104 is equal, when it is expressed in dB, to 20*log((Zeq/(Zeq+Zs))*((Zin+Zs)/Zin))), as was the case in FIG. 2.

Thus, in FIG. 2, during a calibration phase where the antenna receives a sub-GHz signal, antenna 108 is at least partly equivalent to voltage source 200, and a corresponding signal Vin is available on terminal RFin. However, in FIG. 3, during a calibration phase, rather than delivering a sub-GHz signal to antenna 108 to obtain a signal Vin on terminal RFin, it is considered that antenna 108 receives no signal (source 200 shorted) and signal Vin is obtained by means of current source 300. The calibration phase can thus be implemented by means of source 300.

The implementation, in device 1', of a phase of calibration of attenuator 104 by delivering current ical to node 105 due to current source 300 enables avoiding the delivery of a sub-GHz signal to antenna 108, as is the case during the implementation, in device 1, of a phase of calibration of attenuator 104.

An advantage of circuit 100' is that, on implementation of a phase of calibration of attenuator 104, the impedance Zs corresponding to the impedance of the assembly of antenna 108 and of network IMP (FIG. 1) is taken into account, even when this impedance Zs is modified by the environment of device 1'. Thus, the calibration phase may be implemented in the environment of use of device 1'.

According to an embodiment, the calibration step is implemented as follows.

At a step a), an impedance value Zatt of attenuator 104 is selected. At a next step b), while current ical is being delivered to node 105, an output signal of the receive chain is observed. At a next step c), the attenuation introduced by the attenuator for the value Zatt selected at step a) is at least partly determined from the signal observed at step b).

Steps a), b), and c) are repeated for a plurality of values of impedance Zatt. Thus, when device 1' is operating, according to the output signal of the receive chain 101, the gain of the receive chain is adapted by selecting an attenuation value, that is, by selecting the value of impedance Zatt determined during the calibration phase which corresponds to this attenuation value.

Among the values Zatt selected during the calibration phase, according to one embodiment, one of these values corresponds to the case where attenuator 104 is equivalent to an open circuit. In other words, one of the values Zatt selected during the calibration phase is infinite. In this case, the attenuation introduced by attenuator 104 is null, and the signal observed at the output of the chain corresponds to a maximum gain Gmax of the receive chain. It is thus possible to determine, for each of the other values of impedance Zatt the attenuation introduced by attenuator 104 with respect to gain Gmax.

For example, when at step a), the selected impedance Zatt is infinite, at the corresponding step b), the signal observed at the output of the receive chain is equal to Gmax*Vin, and when at another step a), the selected impedance is equal to a value Zatt1, at the corresponding step b), the signal observed at the output of the receive chain is equal to G1*Vin, G1 being the gain of the receive chain for value Zatt1. Gain G1 is equal to Gmax−Att1, Att1 being the attenuation introduced by attenuator 104 when impedance Zatt is equal to Zatt1. Thus, by calculating the ratio of the signal observed at step b) when impedance Zatt is equal to Zatt1 to the signal observed at step b) when impedance Zatt is infinite, the value of the ratio of gain G1 to gain Gmax, and thus the value of attenuation Att1 corresponding to an impedance Zatt equal to Zatt1, is obtained.

According to another example, after having obtained the output signal equal to Gmax*Vin, the value Zattx of impedance Zatt corresponding to a given attenuation Attx is searched. For this purpose, at each step a), the value of impedance Zatt is modified to observe, at a corresponding step b), an output signal of the demodulation chain which is equal to (Gmax−Attx)*Vin. When this signal is observed at a step b), at the next step c), this means that the attenuation is effectively equal to Attx, and thus that the last value selected at step a) for impedance Zatt is value Zattx. Attenuation Attx is thus associated with the value Zattx of impedance Zatt and, in operation, when an attenuation Attx is required, it is then sufficient to select the value Zattx of the attenuator.

Outside of a calibration phase, current source 300 is turned off, for example, by the provision of a switch (not shown in FIG. 3) connected between current source 300 and node 105, the switch then being controlled to the off state to turn off current source 300. According to another example, current source 300 is turned off or on by a control signal directly received by current source 300.

In practice, in device 1', shorting source 200 amounts to shorting antenna 108 (FIG. 1), which is not possible. Thus, according to an embodiment, the calibration phase comprises, between every two successive steps a) and b), a step b') comprising obtaining an output signal of the demodulation chain while current source 300 is off. This enables determining, based on this output signal of the demodulation chain, the contribution of antenna 108 to the output signal. Thereby, during the next step c), the attenuation introduced by the attenuator is determined from the signals obtained at the corresponding steps b) and b'), and is independent from the contribution of antenna 108. In other words, the attenuation is determined as if antenna 108 was effectively shorted.

An advantage of device 1', and more particularly of circuit 100', is that the phase of calibration of attenuator 104 may be implemented in automated fashion by circuit 100', for example, by a digital processing circuit connected at the output of the receive chain and/or by circuit AGC. In other words, the entire calibration phase may be directly carried out by circuit 100'.

Another advantage of circuit 100' is that the attenuation corresponding to each impedance value Zatt is determined more accurately than in circuit 100. Such an increased accuracy particularly results from the fact that each determined attenuation takes into account the environment of device 1'. This increased accuracy also results from the fact that the value of current ical during a calibration phase implemented in device 1' is better controlled than the value of voltage Vin during a calibration phase implemented in device 1. Thus, a hysteresis value on the control of the attenuator 104 of circuit 100' may be smaller than that on the control of the attenuator 104 of circuit 100. In practice, the provision of a hysteresis value on the control of attenuator 104 enables avoiding instabilities when value Zatt is modified to adapt the attenuation to the power of the received sub-GHz signal. This decrease in the hysteresis value enables increasing the dynamics of the receive chain and to decrease the influence of the noise of the receive chain.

Another advantage of circuit 100' is that the calibration step may be implemented after each modification of the operating frequency FRF of device 1'. Thus, device 1', and more particularly its circuit 100', may operate over the entire frequency range for example from 300 MHz to 1 GHz, simply by modifying the frequency of source 300 so that the frequency of current ical is equal to operating frequency FRF. In other words, the calibration of attenuator 104 is performed for the operating frequency FRF of device 1'.

Another advantage of circuit 100' is that the impedance seen on terminal RFin by the sub-GHz signal supplied to this terminal RFin, that is, the input impedance of circuit 100', may be higher than usual impedances of 50 ohms and of 75 ohms, for example may be equal to approximately 100 ohms. This enables working with lower currents in the receive chain, and thus to decrease the power consumption of circuit 100'. This would not be the case if attenuator 104 was replaced with a usual or standard attenuator Pi. Indeed, these attenuators Pi are adapted to receive chains having a well controlled input impedance of 50 ohms or 75 ohms, but are not adapted to higher input impedances which require using an external impedance matching network to couple the antenna to the input of the receive chain, particularly due to the fact that the impedance of the assembly of the antenna and of the impedance matching network is modified by the environment.

According to an embodiment, the value, or the amplitude, of current ical is determined by a maximum power transmitted by antenna 108 not to be exceeded, for example, to respect radio frequency transmission standards. For example, current ical has a root mean square value in the order of 10 µA, for example, so that the power transmitted by antenna 108 when current ical is delivered to node 105 does not exceed −57 dBm per 100-KHz range.

According to an embodiment, attenuator 104 is a variable resistor. For example, attenuator 104 comprises, preferably, is formed by, a MOS transistor ("Metal Oxide Semiconductor"). MOS transistor has a first conduction terminal, for example, its source when the transistor has an N channel, coupled, preferably connected, to node 106, and a second conduction terminal, for example, its drain when the transistor has an N channel, coupled, preferably connected, to node 105. The gate of the transistor receives the control signal of attenuator 104. The value of the on-state resistance of the transistor is then determined by the control signal of attenuator 104, the impedance of the attenuator being preferably equal to the on-state resistance of the transistor.

According to an embodiment, source 300 is configured so that current ical is a pure sinusoid at the operating frequency FRF of device 1'.

However, such a current source may be bulky and complex to implement. Thus, embodiments of current source 300 enabling re-using components, or elements, already present in circuit 100' will now be described.

Figure 4:
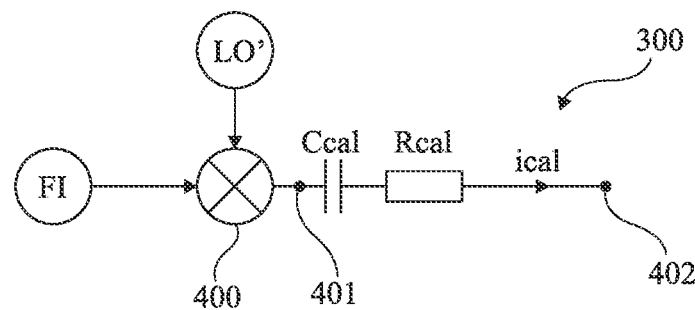
FIG. 4 schematically shows in the form of blocks an embodiment of a current source of the circuit of FIG. 3.

FIG. 4 schematically shows, in the form of blocks, an embodiment of the current source 300 of the circuit 100' of FIG. 1.

In this embodiment, advantage is taken from the fact that the receive chain of circuit 100' comprises at least one local oscillator configured to deliver a signal at frequency FLO, frequency FLO being equal to FRF−Fint or FRF+Fint.

Thus, in FIG. 4, current source 300 comprises a circuit, or local oscillator, LO'. Oscillator LO' is configured to deliver a signal, or voltage, at frequency FLO, that is, at the frequency of a local oscillator of the receive chain, for example, the frequency of the oscillator LO described in relation with FIG. 1. As an example, circuit LO' and the local oscillator LO described in relation with FIG. 1 are one and the same.

Current source 300 further comprises a circuit FI. Circuit FI is configured to deliver a signal, or voltage, at the intermediate frequency Fint of the demodulation chain.

Current source 300 also comprises a frequency mixer 400. Frequency mixer 400 is configured to receive the signal at frequency FLO delivered by oscillator LO' and the signal at frequency Fint delivered by circuit FI. Mixer 400 is configured to multiply, or combine, these signals together.

According to one embodiment, output signals of the oscillator LO' and of circuit FI are sinusoidal. In this embodiment, a signal, or voltage, available at the output of mixer 400 comprises a frequency f3 equal to FLO−Fint and a frequency f4 equal to FLO+Fint. One of frequencies f3 and f4 thus corresponds to operating frequency FRF. The other one of frequencies f3 and f4 corresponds to the image frequency Fim. The output of mixer 400 is coupled, for example, connected, to a node 401.

According to one embodiment, the image frequency in the output signal of the mixer 400 is filtered, in the receive chain 101, by the image frequency rejection device, in the same fashion that the chain 101 filters the image frequency Fim when it is in the sub-GHz signal provided by the antenna 108 to the terminal RFin. As an example, the output of the mixer 400 is then connected to node 401.

According to another embodiment, the receive chain is devoid of image frequency rejection device, and the source 300 comprises an image frequency rejection function in order to suppress the frequency image Fim.

For example, although not shown, the source 300 then comprises, further to the first mixer 400 shown on FIG. 4, a second mixer 400 configured to multiply the output signal of circuit FI with a signal at the frequency FLO but 90° phase shifted with respect to the signal at the frequency FLO received by the first mixer 400. Further, the output of the second mixer 400, after having undergone a new phase shift of 90° with respect to the output signal of the first mixer 400, is added to, or subtracted from, the output of the first mixer 400, for obtaining a signal devoid of the image frequency Fim on node 401.

To convert the voltage available on node 401 into a corresponding current ical, a resistor Rcal couples the node 401 to an output 402 of source 300, the output 402 of current source 300 being coupled, preferably connected, to node 105 (FIG. 3). The value of resistor Rcal is for example determined by the desired value of current ical, this desired value of current ical being for example itself determined by a maximum power transmitted by the antenna not to be exceeded.

According to an embodiment, a decoupling capacitive element Ccal is series-connected with resistor Rcal, between the node 401 and the output 402 of current source 300. Capacitor Ccal enables removing the possible DC ("Direct Current") component present in the signal available on node 401. In other words, capacitive element Ccal is a common-mode removal capacitive element.

Figure 5:
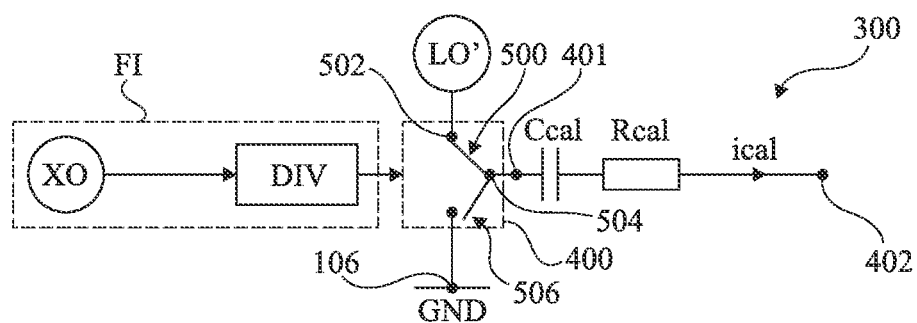
FIG. 5 schematically shows in the form of blocks details of the current source of FIG. 4 according to an embodiment.

FIG. 5 schematically shows in the form of blocks details of the current source 300 of FIG. 4 according to an embodiment.

In the embodiment of FIG. 5, circuit FI delivers a square output signal at frequency Fint. This allows a simple implementation of mixer 400.

Thus, according to an embodiment, mixer 400 is a switching frequency mixer configured to be controlled by the square output signal of circuit FI. For example, mixer 400 is configured so that its output signal is substantially equal to the output signal of oscillator LO' when the output signal of circuit FI is at a first level, for example corresponding to the high state of this signal, and so that its output signal is null when the output signal of circuit FI is at a second level, for example corresponding to the low state of this signal.

According to an embodiment, mixer 400 comprises a switch 500 coupling a node 502 to the output 504 of the mixer, and a switch 506 coupling the output 504 of mixer 400 to node 106, node 502 being configured to receive the output signal of oscillator LO'. Switches 500 and 504 are controlled in phase opposition, from the output signal of circuit FI. In other words, mixer 400 comprises a switch controlled by the output signal of circuit FI, the switch being configured to couple the output 504 of mixer 400 selectively to node 106 or to the output of circuit FI.

According to an embodiment, circuit FI comprises an oscillator XO and a frequency divider DIV. Oscillator XO is configured to deliver a signal at a frequency greater than frequency Fint of the demodulation chain. Frequency divider DIV is configured to receive the output signal of oscillator XO. The frequency divider is further configured to deliver the output signal of circuit FI from the signal delivered by oscillator XO. As an example, the output signal of oscillator XO is a square signal. Preferably, frequency divider DIV is implemented from a chain of flip-flops.

According to an embodiment, oscillator XO is a quartz oscillator configured to deliver a square signal, for example, at a frequency in the range from 47 MHz to 50 MHz. Advantage can then be taken from the fact that such a quartz oscillator is generally present in circuit 100' (FIG. 3) where it is used for other functions, for example to generate a clock signal of the digital circuit(s) of circuit 100'. In other words, according to an embodiment, quartz oscillator XO is configured to deliver its output signal to at least another circuit of circuit 100' in addition to circuit DIV, this other circuit being not a part of the current source 300.

In the embodiment of FIG. 5 where the signal delivered by circuit FI is a square signal at frequency Fint, according to one embodiment, the signal delivered by circuit LO' is a sine wave signal. In this case, the output signal of the mixer 400 comprises frequency FRF, image frequency and also frequencies equal to FLO−n*Fint and to FLO+n*Fint, n being a strictly positive integer, and being, for example, odd.

According to an embodiment, the image frequency Fim will be filtered by the image frequency rejection device of the receive chain 101, and the harmonic frequencies will be also filtered by the receive chain, for example by the filter(s) IF.

As a variant, the current source 300 implements an image frequency rejection function, resulting in the signal on node 401 is devoid of the image frequency Fim. The implementation of this image frequency rejection function in the source 300 is in the capabilities of those skilled in the art from the functional and structural indications given in relation with FIG. 4. The harmonic frequencies of the signal on node 401 will be filtered by the receive chain 101, for example by the filter(s) IF.

Figure 6:
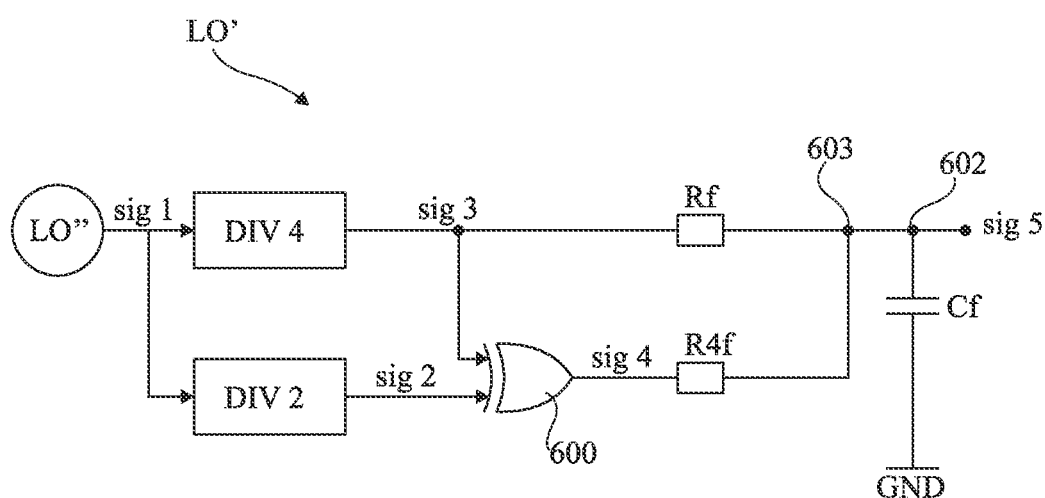
FIG. 6 schematically shows in the form of blocks other details of the current source of FIG. 4 according to an embodiment.

FIG. 6 schematically shows in the form of blocks other details of the current source 300 of FIG. 4 according to an embodiment. More particularly, FIG. 6 illustrates an embodiment of oscillator LO'.

In this embodiment, oscillator LO' comprises an oscillator LO". Oscillator LO" is configured to deliver a square signal sig1 at a frequency FLO4 equal to four times frequency FLO. The low state of signal sig1 is equal to 0 V, or, in other words, to reference potential GND.

Oscillator LO' further comprises a frequency divider DIV2 and a frequency divider DIV4.

Frequency divider DIV2 is configured to receive signal sig1 and to divide the frequency FLO4 thereof by two. In other words, frequency divider DIV2 is configured to deliver a signal sig2 corresponding to signal sig1 having had its frequency FLO4 divided by two. A frequency FLO2 of signal sig2 is thus equal to twice frequency FLO. Signals sig1 and sig2 have the same amplitude.

More exactly, frequency divider DIV2 is configured to switch signal sig2 at each edge of a first type of signal sig1, for example, at each falling edge of signal sig1.

The frequency divider DIV4 is configured to receive the signal sig1 and to divide the frequency FLO4 thereof by four. In other words, frequency divider DIV4 is configured to deliver a signal sig3 corresponding to signal sig1 having had its frequency FLO4 divided by four. A frequency of signal sig3 is thus equal to frequency FLO. Signals sig1 and sig3 have the same amplitude.

More exactly, frequency divider DIV4 is configured to switch signal sig3 every two edges of a second type of signal sig1, for example, every two rising edges of signal sig1, the first type of edge being different from the second type of edge, and the first and second types being selected among the rising and falling types.

Oscillator LO' comprises an XOR gate bearing reference 600 in FIG. 6. Gate 600 has two inputs. A first input of gate 600 is configured to receive signal sig2, a second input of gate 600 being configured to receive signal sig3. Gate 600 is configured to deliver a signal sig4. As well known by those skilled in the art, gate 600 implements an XOR function between signals sig2 and sig3. In other words, signal sig4 is in the high state when signals sig2 and sig3 are in different high and low states, and in the low state when signals sig2 and sig3 are in the same high or low state.

Oscillator LO' further comprises a resistor Rf coupling the output of frequency divider DIV4 with the output 602 of oscillator LO', and a resistor R4f coupling the output of frequency divider DIV2 with the output 602 of oscillator LO'.

The value of resistance Rf is substantially equal, preferably equal, to 0.348/0.84 times the value of resistance R4f. Thereby, a signal sig5 available on output 602 of oscillator LO" is substantially equal, for example, equal, to 0.84 times signal sig3 plus 0.38 times signal sig4. As a result, signal sig5 has the shape of a sinusoid, although signal sig5 is not a sine wave signal. The fundamental frequency of signal sig5 is frequency FLO.

In the illustrated example, resistor Rf is connected between the output of frequency divider DIV4 and a node 603, and resistor Rf4 is connected between the output of gate 600 and node 603, node 603 being connected to node 602.

In another example, not illustrated, resistor Rf is connected between the output of frequency divider DIV4 and node 603, and resistor R4f is connected between the output of gate 600 and node 603, node 603 being coupled to output 602 by a common-mode removal capacitive element, so that signal sig5 is centered on potential GND or, in other words, has a null average value.

It has been observed that, as compared with a square signal at frequency FLO, signal sig5 contains no harmonics having a rank smaller than or equal to 6. In other words, in addition to having no harmonics of rank 2, 4, and 6, signal sig5 does not comprise the harmonics of ranks 3 and 5, which are present in the square signal.

This is particularly advantageous since, when signal sig5 is delivered to switched-mode mixer 400 controlled by a square signal at frequency Fint, the harmonics of ranks 3 and 5 of signal sig5 result in unwanted currents superposing to current ical. These unwanted currents are not filtered by the receive chain and contribute to the output signal of the receive chain due to their frequencies. Indeed, although the receive chain is frequency selective, especially due to the filter(s) IF therein, the use of a square signal sig5 and of a square output signal of circuit FI (FIGS. 4 and 5) would lead to an output signal of the mixer 400 having many different frequencies, at least some of which could be brought to the intermediate frequency Fint by the mixer(s) 102 of the receive chain 101, especially when mixer(s) 102 are of the switched-mode type.

Although the harmonics of ranks greater than 6 of signal sig5 may also result in such unwanted currents, their contribution to the output signal of the receive chain is considered as negligible. Indeed, in the output signal of a switched-mode frequency mixer having its switches controlled by a square signal, as it is, for example, the case of mixer(s) 102 of the receive chain 101, the power of the harmonics coming from the square signal decrease with the rank of the considered harmonic. Thus, even if signal sig5, thus current ical, comprise harmonics of ranks greater than 6, and that these harmonics are brought back to the frequency Fint when combined, in a switched-mode mixer 102, with the harmonics of the square signal at the frequency FLO, their impact on the power carried by frequency Fint of the output signal of the mixer 102 is negligible. However, optionally, oscillator LO' comprises a low pass filter (not shown), preferably tunable. This filter is configured to filter harmonics of ranks greater than 6 of signal sig5. As an example, this filter is implemented by a resistor, preferably variable, and a capacitive element series-connected between node 106 and the output 602 of oscillator LO'. The tunable resistance is for example implemented by a MOS transistor and then corresponds to the on-state resistance of this MOS transistor.

Preferably, oscillator LO' comprises a smoothing capacitive element Cf. Capacitive element Cf is configured to smooth or filter the shape of signal sig5. Capacitive element Cf is connected between the output 602 of oscillator LO" and node 106 at potential GND. Said in other words, capacitive element Cf associated with the resistance of node 603 form a low-pass filter, simple and uncritical, which filters the harmonics of ranks greater than 6 of signal sig5, without any action on the fundamental frequency of signal sig5.

According to an embodiment, oscillator LO" and, preferably, one and/or the other of frequency dividers DIV2 and DIV4, are also used in circuit 100' to generate at least one signal at frequency FLO configured to be delivered to at least one corresponding frequency mixer of the receive chain. The at least one mixer, for example, mixer 102 (FIG. 1), is for example configured to multiply, or mix, the at least one signal at frequency FLO with the output signal of the amplifier LNA of the receive chain. In other words, oscillator LO" and, preferably, one and/or the other of frequency dividers DIV2 and DIV4, form part of at least one local oscillator, for example, of oscillator LO (FIG. 1), of the receive chain. This enables reusing oscillator LO" and, preferably, one and/or the other of dividers DIV2 and DIV4 already present in circuit 100' to implement the oscillator LO' of FIG. 6.

Figure 7:
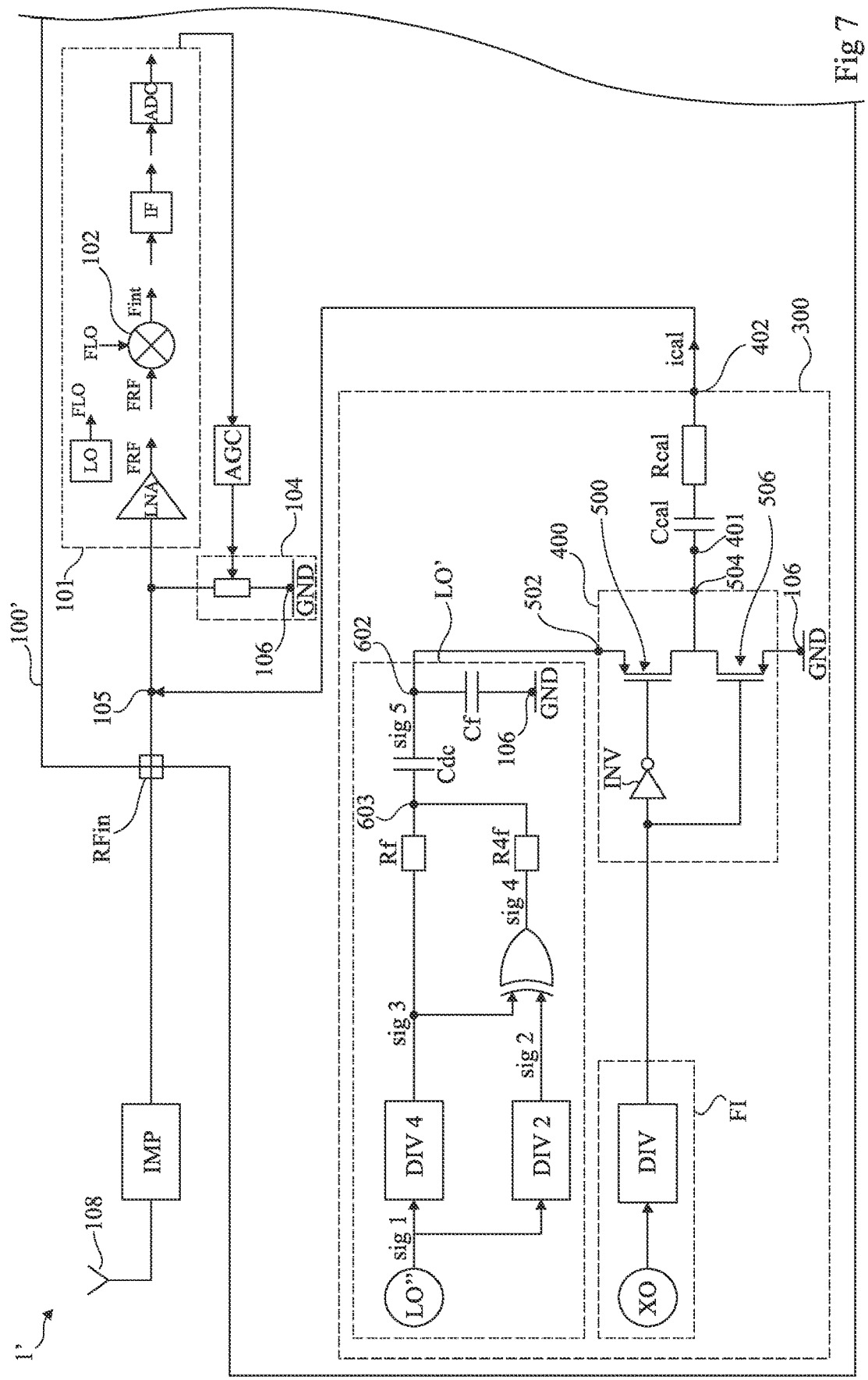
FIG. 7 schematically shows in the form of blocks an embodiment of a circuit comprising a radio frequency receive chain.

FIG. 7 schematically shows in the form of blocks an embodiment of the circuit 100' described in relation with FIG. 3 and, more exactly, an embodiment of the device 1' described in relation with FIG. 3.

In FIG. 7, device 1' comprises circuit 100', antenna 108, and impedance matching network IMP coupling antenna 108 to the input terminal RFin of circuit 100'.

Circuit 100' comprises the receive chain 101, the receive chain comprising the amplifier LNA coupled to terminal RFin. The circuit 100' further comprises the controllable impedance 104 connected between node 105 and node 106. In the shown example, the rest of the receive chain 101 is identical to what has been described in relation with FIG. 1. Thus, the chain 101 comprises at least one mixer 102, the local oscillator LO, at least one filter IF, and at least one converter ADC. However, the embodiments and variants described in relation with FIGS. 3 to 7 are not limited to the example of receive chain 101 described in relation with FIG. 1, and it will be within the abilities of those skilled in the art to provide other examples of receive chain comprising the amplifier LNA coupled, preferably connected, to terminal RFin of circuit 100'.

Further, circuit 100' comprises circuit AGC for controlling attenuator 104. As an example, circuit AGC is configured to receive the modulus of signals I and Q, to compare the modulus of signals I and Q with a maximal value and a minimal value and to increase or decrease the attenuation of the signal received on terminal RFin based on the result of these comparisons. As an example, circuit AGC comprises a digital circuit, for example a state-machine, configured to receive the results of the comparisons, and to select a value of impedance of attenuator 104 based on the result of these comparison. As an example, circuit AGC comprises a look up table, in which attenuation values and corresponding impedance values of the attenuator 104 determined during the calibration phase are stored. As an example, each impedance value of the attenuator 104 is stored in the look up table under the form of a digital code. Each digital code is for example configured, when provided to a digital-to-analog converter DAC of the AGC circuit, so that the converter DAC provides corresponding analog control signal to the attenuator 104.

Further, circuit 100' comprises source 300 configured to deliver current ical to node 105, node 105 being connected to terminal RFin and/or to the input of the amplifier LNA.

In the embodiment of FIG. 7, source 300 is implemented as described in relation with FIG. 5, oscillator LO' being implemented as described in relation with FIG. 6.

As an example, in FIG. 7, the switch 500 of mixer 400 is an N-channel MOS transistor having its source coupled, preferably connected, to node 502 and its drain coupled, preferably connected, to the output 504 of mixer 400, the switch 506 of mixer 400 being an N-channel MOS transistor having its source coupled, preferably connected, to node 106 and its drain coupled, preferably connected, to the output 504 of mixer 400. In this example, the gate of transistor 500 receives the complementary of the output signal of circuit FI, and the gate of transistor 506 receives the output signal of circuit FI, although the inverse is also possible. As an example, the complementary of the output signal is available at the output of an inverter INV having its input receiving the output signal of circuit FI.

Preferably, when the switches 500 and 506 of mixer 400 are N-channel MOS transistors and oscillator LO' is implemented as described in relation with FIG. 6, a common-mode removal capacitive element Cdc couples node 603 to the output 602 of oscillator LO'. This enables increasing the minimum amplitude of the voltage between the gate and the source of transistor 500, when transistor 500 is controlled to be on and its gate receives a voltage corresponding to the high state of the output signal of circuit FI. In other words, this enables decreasing the on-state resistance of transistor 500. Further, this capacitive element Cdc allows that the low level, or low state, of signals sig1, sig2, sig3 and sig4 corresponds to the ground GND, so that divider DIV2, DIV4 and gate 600 does not draw DC current, which would increase the consumption of the oscillator LO'.

As an example, in FIG. 7, source 300 may be turned off by deactivating frequency divider DIV so that the output of circuit FI is in a state for which transistor 506 is on and transistor 500 is off. According to another example, source 300 may be turned off by drawing to ground GND the gate of transistor 506. It will be within the abilities of those skilled in the art to provide other ways to turn off source 300.

Various embodiments and variants have been described. Those skilled in the art will understand that certain features of these various embodiments and variants may be combined, and other variants will occur to those skilled in the art. In particular, although examples of chain 101 having converter(s) ADC disposed at the end of the chain, after filter(s) IF, or even after an image frequency rejection device, have been described, in other examples of receive chains, filter(s) IF and/or the image frequency rejection device may be implemented by digital functions, converters ADC being then disposed upstream of these digital function, by being, for example, connected to the output of the mixer(s) 102.

Further, although in the above description the controllable impedance 104 has been described as being outside the chain 101, it is possible to consider that impedance 104 and/or circuit AGC are part of the receive chain 101.

Furthermore, although it has been not described or illustrated, the above described embodiments and variants apply to the case where the image frequency rejection function is done by a filter, generally called antenna filter, disposed outside circuit 100', that is, upstream of the terminal RFin with respect to the propagation direction of an RF signal in device 1'. Note that in this case, the impedance of this antenna filter is comprised in the impedance Zs described in relation with FIGS. 2 and 3.

Finally, the practical implementation of the described embodiments and variations is within the abilities of those skilled in the art based on the functional indications given hereabove. In particular, the details of implementation of the phase of calibration of attenuator 104 and/or the details of implementation of circuit AGC are within the abilities of those skilled in the art based on the functional indications given hereabove. Further, it will be in the abilities of those skilled in the art, from the functional and/or structural indications given in relation with FIG. 4, to implement an image frequency rejection function directly in the current source 300 in the case where the current source 300 is implemented as described in relation with any of FIGS. 5, 6 and 7.

What is claimed is:

1. A circuit comprising:
   an input terminal configured to receive a first signal at a first frequency;
   a demodulation chain comprising a low-noise amplifier having an input coupled to the input terminal;
   a controllable variable impedance connected between a first node and a node configured to receive a reference potential, wherein the first node is connected to the input terminal and/or to the amplifier input; and
   a current source configured to deliver a current at the first frequency to the first node.

2. The circuit of claim 1, wherein the current source comprises:
   a first circuit configured to deliver a second signal at a frequency of a local oscillator of the demodulation chain;
   a second circuit configured to deliver a third signal at an intermediate frequency of the demodulation chain;
   a frequency mixer configured to receive the second and third signals, wherein an output of the frequency mixer is coupled to an internal node of the current source; and
   a resistor coupling the internal node to the first node.

3. The circuit of claim 2, wherein the third signal is a square signal and the frequency mixer is a switch-mode mixer controlled by the third signal.

4. The circuit of claim 3, wherein the second circuit comprises an oscillator configured to deliver a signal at a frequency greater than the intermediate frequency of the demodulation chain, and a frequency divider configured to deliver the third signal from the signal delivered by the oscillator.

5. The circuit of claim 4, wherein the oscillator of the second circuit is a quartz oscillator.

6. The circuit of claim 3, wherein the mixer comprises a first switch connected between the output of the mixer and a node configured to receive the second signal, and a second switch connected between the output of the mixer and the node configured to receive the reference potential, wherein the first and second switches are configured to be controlled in phase opposition from the third signal.

7. The circuit of claim 2, wherein the first circuit comprises:
   a circuit configured to deliver a fourth square signal at a frequency equal to four times the frequency of the local oscillator;
   a first frequency divider configured to divide by two the frequency of the fourth square signal;
   a second frequency divider configured to divide by four the frequency of the fourth square signal;
   a two-input gate configured to receive an output signal of the first frequency divider and an output signal of the second frequency divider, wherein the gate is configured to implement an XOR function between the signals received by its inputs;
   a first resistor coupling an output of the second frequency divider to an output of the first circuit; and
   a second resistor coupling an output of the gate to the output of the first circuit.

8. The circuit of claim 7, wherein a value of the first resistor is substantially equal, for example, equal, to 0.348/0.84 times a value of the second resistor.

9. The circuit of claim 2, wherein the current source comprises a common-mode removal capacitive element, wherein the resistor coupling the internal node of the current source to the first node is series-connected with the common-mode removal capacitive element between the internal node and the first node.

10. The circuit of claim 1, wherein the current source is further configured to be selectively turned on or off.

11. A method of operating a circuit, the method comprising:
   a) receiving, by an input of a low-noise amplifier in a demodulation chain, a first signal at a first frequency;
   b) delivering, by a current source, a current at the first frequency to a first node coupled to the input of the low-noise amplifier;
   c) selecting a value of a controlled variable impedance coupled between the first node and a reference potential node;
   d) obtaining a signal at an output of the demodulation chain, while the current is delivered to the first node by the current source; and
   e) determining, for the variable impedance value selected at step c), an attenuation value, introduced into the demodulation chain by the variable impedance, at least from the signal obtained at step d).

12. The method of claim 11, further comprising:
   between steps c) and e), a step d') comprising obtaining another signal at the output of the demodulation chain while the current source is off; and
   at step e), determining the attenuation value at least from the signal obtained at step d) and from the another signal obtained at step d').

13. The method of claim 11, further comprising repeating steps c) and e) for each of a plurality of values of the variable impedance.

14. The method of claim 13, wherein at one of the steps c), the variable impedance is equivalent to an open circuit for the selected value.

15. The method of claim 14, further comprising, at each step e), determining the attenuation value at least from the signal observed at the corresponding step d) and from the signal observed at step d) when the variable impedance is equivalent to the open circuit.

16. The method of claim 11, further comprising:
   delivering, by a first circuit of the current source, a second signal at a frequency of a local oscillator of the demodulation chain;
   delivering, by a second circuit of the current source, a third signal at an intermediate frequency of the demodulation chain;
   receiving, by a frequency mixer having an output coupled to an internal node of the current source, the second and third signals; and
   coupling, by a resistor, the internal node to the first node.

17. The method of claim 16, wherein the third signal is a square signal and the frequency mixer is a switch-mode mixer controlled by the third signal.

18. The method of claim 17, further comprising:
   delivering, by an oscillator of the second circuit, a signal at a frequency greater than the intermediate frequency of the demodulation chain; and
   delivering, by a frequency divider of the second circuit, the third signal from the signal delivered by the oscillator.

19. The method of claim 17, further comprising controlling first and second switches of the mixer in phase opposition from the third signal, the first switch being connected between the output of the mixer and a node receiving the second signal, and the second switch connected between the output of the mixer and the reference potential node.

20. The method of claim 16, further comprising:
delivering, by a fourth circuit of the first circuit, a fourth square signal at a frequency equal to four times the frequency of the local oscillator;
dividing, by a first frequency divider of the first circuit, by two the frequency of the fourth square signal;
dividing, by a second frequency divider of the first circuit, by four the frequency of the fourth square signal;
receiving, by a two-input gate of the first circuit, an output signal of the first frequency divider and an output signal of the second frequency divider,
implementing, by the gate, an XOR function between the signals received by its inputs;
coupling, by a first resistor of the first circuit, an output of the second frequency divider to an output of the first circuit; and
coupling, by a second resistor of the first circuit, an output of the gate to the output of the first circuit.

* * * * *